United States Patent
Hochschild et al.

(10) Patent No.: US 6,894,548 B2
(45) Date of Patent: May 17, 2005

(54) CIRCUIT FOR MODIFYING A CLOCK SIGNAL TO ACHIEVE A PREDETERMINED DUTY CYCLE

(75) Inventors: James R. Hochschild, Plano, TX (US); Donald C. Richardson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/384,262

(22) Filed: Mar. 7, 2003

(65) Prior Publication Data

US 2004/0174196 A1 Sep. 9, 2004

(51) Int. Cl.[7] .............................................. H03K 3/017
(52) U.S. Cl. ..................................... 327/175; 327/263
(58) Field of Search .................. 327/35, 170, 172–176, 327/261–264, 276–278, 285, 288, 298, 536–537; 331/57

(56) References Cited

U.S. PATENT DOCUMENTS 6,242,960 B1 * 6/2001 Bae ............................. 327/299
6,414,522 B1 * 7/2002 Nguyen et al. ............. 327/101
6,529,058 B2 * 3/2003 Gupta ......................... 327/276
6,617,935 B1 * 9/2003 Nguyen ....................... 331/57
6,664,834 B2 * 12/2003 Nair et al. .................. 327/175
6,670,838 B1 * 12/2003 Cao ............................ 327/175

* cited by examiner

Primary Examiner—My-Trang Nuton
(74) Attorney, Agent, or Firm—W. Daniel Swayze, Jr.; W. James Brady; Frederick J. Telecky, Jr.

(57) ABSTRACT

The present invention accepts timing and clock signals with a desired frequency and undesired duty cycle CLKIN, and outputs a clock signal CLKOUT with the desired frequency and desired duty cycle. If the clock signal is known to have a duty cycle of greater than 50%, one exemplary embodiment of the present invention delays the rising edge of the clock signal so as to produce a clock signal with a 50% duty cycle. One exemplary embodiment of the present invention comprises a charge pump integrator (102) configured in a feedback loop, the output of the charge pump integrator (102) operable as a controlling node to delay inverter (115). If the clock signal CLKIN at the input of the circuit has a duty cycle of greater than 50%, then the charge pump integrator (102) will, through PBIAS, cause delay inverter 115 to delay of the rising edge of CLKIN through delay inverter (115). The charge pump integrator, through PBIAS, drives the duty cycle of the clock signal towards 50%.

17 Claims, 4 Drawing Sheets

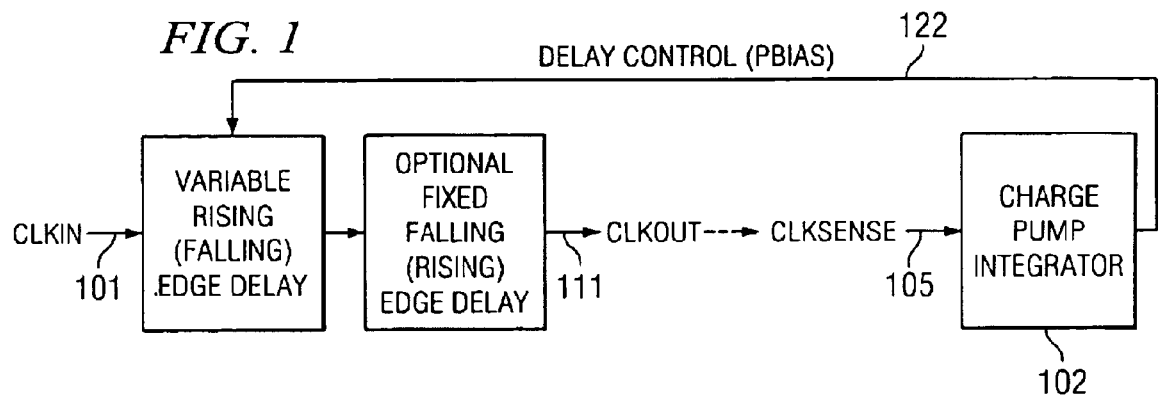
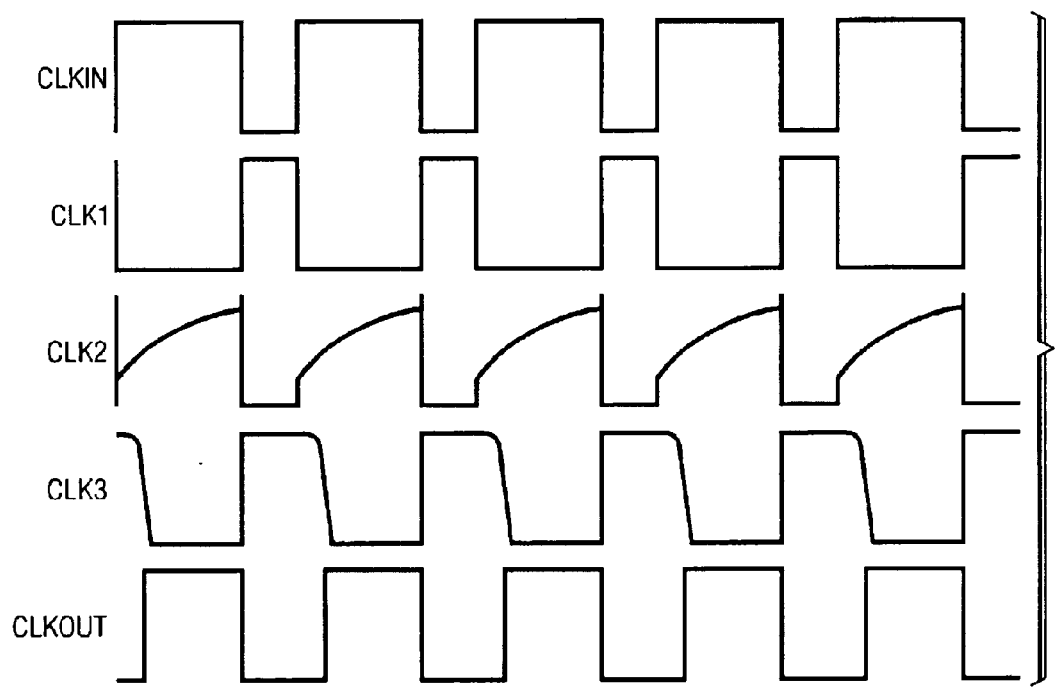

CIRCUIT FOR MODIFYING A CLOCK SIGNAL TO ACHIEVE A PREDETERMINED DUTY CYCLE

RELATED APPLICATIONS

This application is related to U.S. Provisional patent application entitled Variable Adaptive Quantization in Sigma-Delta Modulators, filed Feb. 13, 2003, Ser. No. 60/447,160 and U.S. patent applications Ser. No. 10/381,138 entitled Improved Level-Shifter each filed herewith, the teachings of each application incorporated herein by reference.

FIELD OF THE INVENTION

The present invention generally relates to circuits designed to output timing and clock signals with a desired duty cycle.

BACKGROUND OF THE INVENTION

The duty cycle is an important characteristic of a periodic digital waveform. The duty cycle is generally defined as the ratio of the pulse width ($t_w$) to the period (T) and can be expressed as a percentage.

$$\text{Duty cycle} = \left(\frac{t_w}{T}\right) 100\%$$

The demand for less expensive, lower power and yet more reliable integrated circuit components for use in communication, imaging and high-quality video applications continues to increase rapidly. Integrated circuit manufacturers are requiring improved performance in the clock signal references for such components and devices to meet the design requirements of such emerging applications. Digital signal processors ("DSPs") are integral components of these devices. DSPs are one of a variety of devices that require a clock signal with a predetermined duty cycle for proper operation.

To be processed in a DSP system, analog signals must first be converted into digital format. These digital signals are then converted back to an analog signal after being processed by the DSP, for example, for output to a speaker in the case of audible sounds. A coder/decoder device ("Codec") is often used as a front-end to a DSP. The Codec integrates analog to digital and digital to analog conversion functions on the Codec device. If a device, such as a DSP, requires a clock signal operating at a certain frequency and duty cycle, in many cases the oscillator from the Codec provides such clock signal. For example, it is often desirous to take the generated clock signal and export it from the Codec to the DSP chip.

In order to keep power consumption down, a Codec may only be able to export a clock signal with the desired frequency if it has an irregular duty cycle. This is problematic as DSPs are sensitive to the duty cycle of the clock signal. In the case of DSP, a clock signal with a substantially 50% duty cycle is typically desired. A clock signal with a 50% duty cycle is often described as having a square shape that is high for half of the clock period and low for half of the clock period. The described embodiment of the present invention is able to convert, for example, a clock signal of the desired frequency that has a waveform that is high 67% of the time and low 33% of the time, to a clock signal with the desired frequency that has a waveform that is high 50% of the time and low 50% of the time.

To illustrate, a DSP may require a clock signal with a frequency of 5 MHz and 50% duty cycle. However, the highest frequency clock available to the DSP from a Codec may only be 2.5 MHz. One solution is to increase the clock frequency. However, it is well known in the art that increasing the clock frequency increases the power consumption of a circuit. To overcome this issue, the Codec oscillator that generates the 2.5 MHz clock signal can be adapted to output three (3) different phases of the 2.5 MHz clock signal. Using exclusive-OR techniques, two (2) of the phases can be combined to create the desired 5 MHz clock signal while only minimally increasing the power consumption. However, because the two (2) clock phases are 120° out of phase with respect to one another, the 5 MHz signal may have a duty cycle, that is not high 50% of the time and low 50% of the time, but rather is high 67% of the time and low 33% of the time.

One method for achieving a 50%, or other desired duty cycle, is through the use of phase locked loop ("PLL") circuits. However, these circuits are complex, requiring many more semiconductor devices, and thus increased chip surface area. Other solutions, such as using comparators, have higher power requirements.

It is an objective of the present invention to provide a clock signal with the desired clock frequency and duty cycle by modifying the clock signal from an oscillator, e.g., from an onboard Codec or similar device having a low operating voltage and a small surface area.

SUMMARY OF THE INVENTION

The present invention achieves technical advantages as a circuit designed to accept a clock signal with a desired frequency that has a duty cycle which is different from that required by a subsequent stage or circuit of a device, and modify it such that it has both the desired frequency and the required duty cycle. For example, a clock signal may have the desired frequency and a duty cycle that is greater than 50%, however, a circuit may require a clock signal with the desired frequency and a 50% duty cycle.

If a clock signal is known to have a desired frequency and a duty cycle greater than 50%, one exemplary embodiment of the present invention may be used to produce a clock signal with such desired frequency and a duty cycle of 50%. One embodiment of the present invention comprises two current sources within a charge pump integrator, the current sources having a certain ratio, such as 1 to 1, to achieve a 50% duty cycle, the output from the charge pump integrator being used to control bias to a delay inverter. If the clock signal at the input of the circuit does not have a 50% duty cycle, then the charge pump integrator will integrate using a capacitor such that it will adjust the delay of the delay inverter such that it will drive the duty cycle of the clock signal towards 50%. In this manner, the circuit comprises a negative feedback loop.

More specifically, one exemplary embodiment of the present invention comprises a charge pump integrator configured in a feedback loop, the output of such charge pump integrator comprising a controlling node of a delay inverter, the delay inverter comprising a first PMOS transistor, a second PMOS transistor and an NMOS transistor. A capacitor of the charge pump integrator is coupled across the gate and source of the first PMOS transistor where the source of the first PMOS transistor is coupled to a first voltage rail Vdd. The drain of the first PMOS transistor is coupled to the source of the second PMOS transistor and the drain of the second PMOS transistor is coupled to the drain of the NMOS transistor. The source of the NMOS transistor is coupled to a second voltage rail Vss and the gate of the second PMOS transistor is coupled to the gate of the NMOS transistor. A clock signal is introduced at the input through a buffer to the gates of the second PMOS transistor and NMOS transistor. The output of the charge pump integrator, PBIAS, is applied to the controlling node of the delay inverter, that node being where it couples the gate of the first PMOS transistor to the charge pump integrator capacitor. Advantageously, one exemplary embodiment of the present invention provides the desired output clock duty cycle using only 2 to 3 micro-amps of power supply current.

BRIEF DESCRIPTION OF THE DRAWINGS

For a more complete understanding of the present invention, reference is made to the following detailed description taken in conjunction with the accompanying drawings wherein:

FIG. 1 is a block diagram of one embodiment of the invention;

FIG. 3 is a timing diagram illustrating the operation of the present invention.

DETAILED DESCRIPTION OF THE INVENTION

Figure 2A:
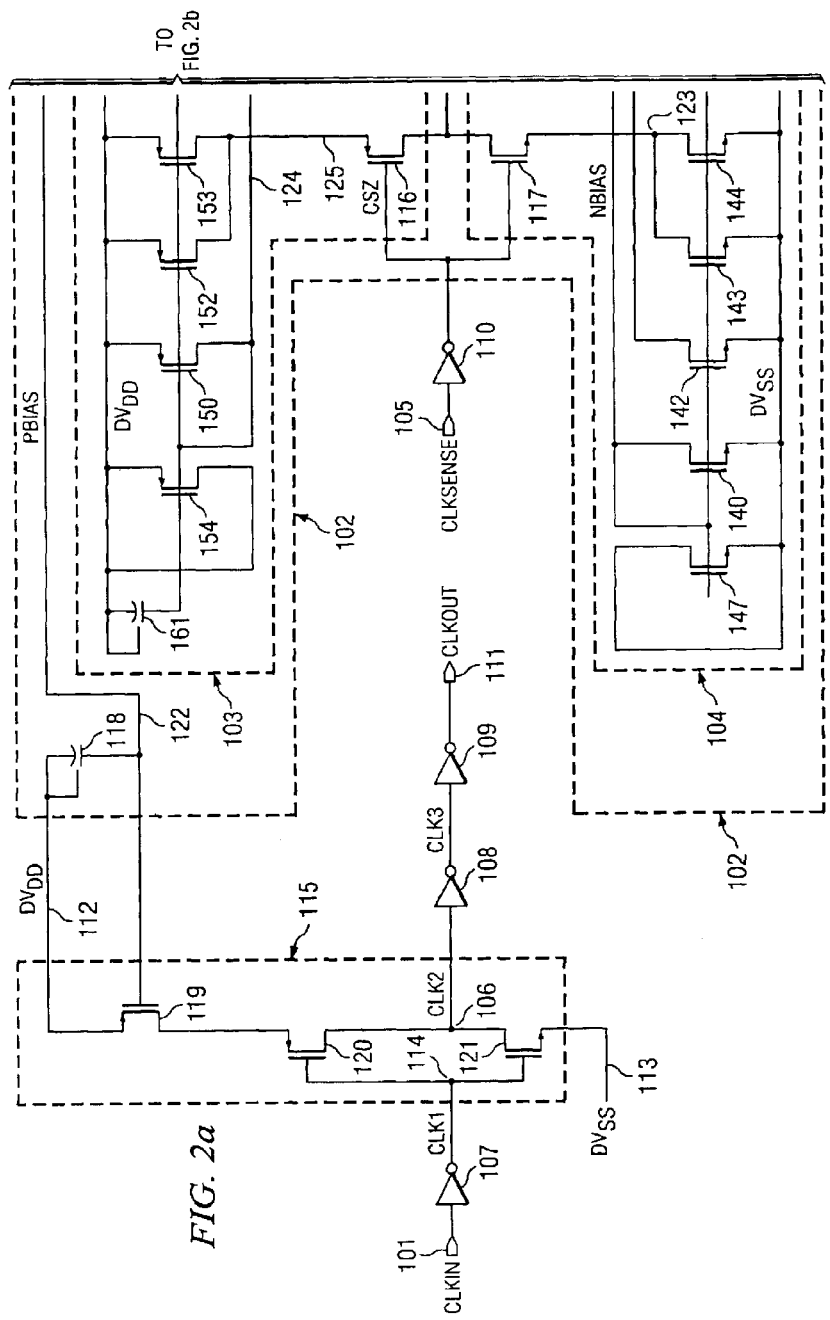
FIG. 2 illustrates a schematic diagram of one exemplary embodiment of the present invention.

The numerous innovative teachings of the present invention will be described with particular reference to one exemplary embodiment. However, it should be understood that this exemplary embodiment provides only one example of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

The present invention, as shown in FIG. 1, is designed to accept a clock signal with a desired frequency, that does not have a duty cycle required by a circuit or a device, at input 101 and modify the clock signal so that it has both the desired frequency and the desired duty cycle at output 111. One exemplary embodiment described herein accepts a clock signal with a desired frequency of 5 MHZ and a duty cycle of greater than 50%, and outputs a clock signal with the desired frequency of 5 MHZ and a duty cycle of 50%. The 5 MHz frequency can be derived from the combination of output phases of a conventional 2.5 MHz oscillator and an irregular duty cycle, and output a clock signal with a 5 MHz frequency with a 50% duty cycle.

Figure 2B:
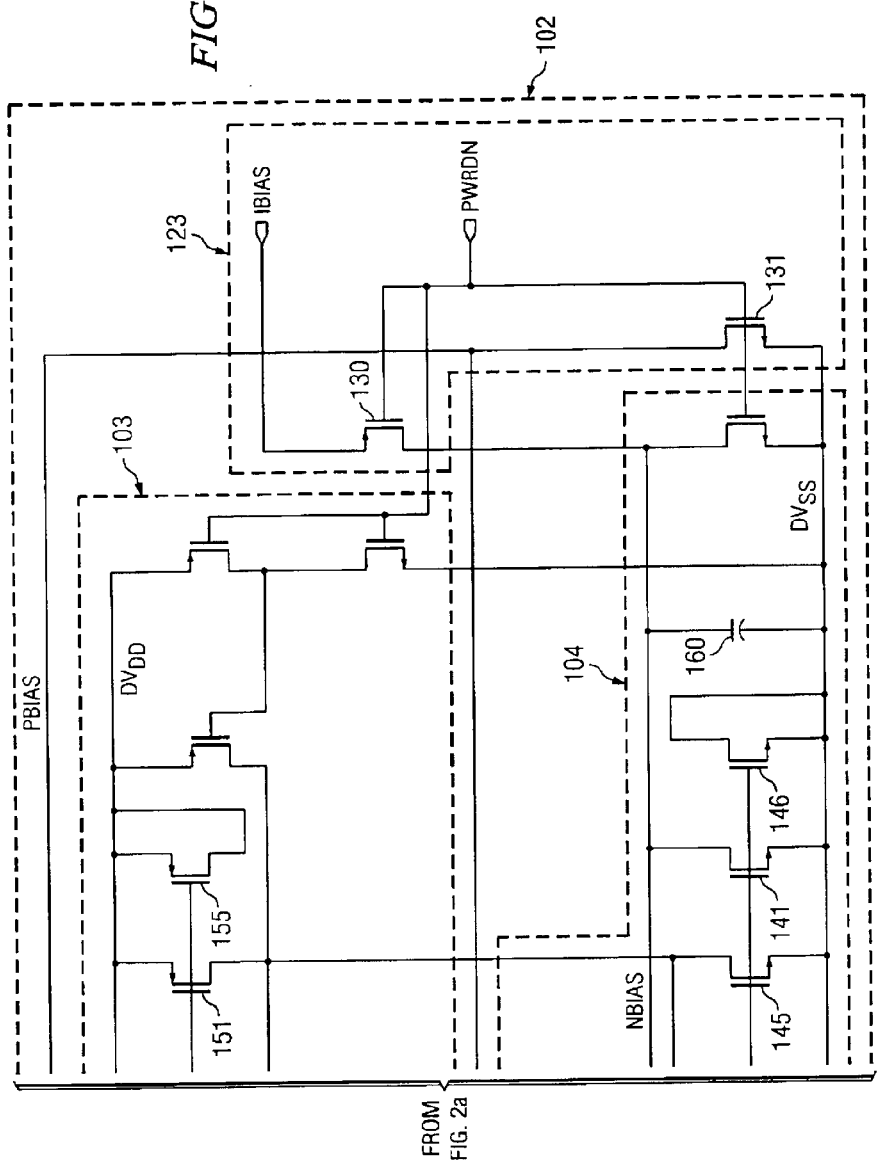

As referenced in FIG. 2, the clock signal CLKIN is introduced at CLKIN pin 101. The signal is inverted when it goes through buffer inverter 107. The inverted signal is output as CLK1 and introduced to delay inverter 115. Delay inverter 115 is comprised of PMOS transistor 119, PMOS transistor 120 and NMOS transistor 121. A conventional inverter comprised of just PMOS transistor 120 and NMOS transistor 121 would not skew the duty cycle. However, the novel configuration of delay inverter 115 skews the duty cycle of the clock signal to achieve the objectives of the invention.

With further reference to FIG. 2, the rising edge of signal CLKIN introduced at CLKIN pin 101 is delayed by controlling the pull-up strength of PMOS transistor 119, which is controlled by PBIAS at node 122 and capacitor 118. CLKSENSE pin 105 may be connected directly to CLK2 at node 106, or a buffered version at CLKOUT pin 111. This connection allows removal of duty cycle skew from the buffer. When the duty cycle of a signal into CLKSENSE is 50%, the DC average of PBIAS is stable. If the duty cycle is not 50%, negative feedback causes the signal to the control of delay inverter 115 to integrate up or down until the duty cycle of CLKSENSE is 50%. This circuit may be easily modified to work with clock signals with less than a 50% duty cycle by inverting the clock input and output.

With reference to FIG. 3, input clock signal CLKIN is shown with an approximately 67% high and 33% low duty cycle. Inverted signal CLK1 is shown at node 114 and signal CLK2 is seen at node 106. Delay inverter 115 is operable to delay the falling edge of CLK1 while no modification is made on rising edge of CLK1. By delaying the falling edge of CLK1 by a predetermined amount, and leaving the rising edge of CLK1 approximately where it is, then the output at node 111, CLKOUT, will have an approximate 50% duty cycle.

Referring back to FIG. 2, as noted above, delay inverter 115 is used to delay the falling edge of CLK1. Delay inverter 115 is comprised of PMOS transistor 119, PMOS transistor 120 and NMOS transistor 121. The gate of PMOS transistor 119 is controlled by PBIAS. Because of the series connection of the PMOS transistor 119 with PMOS transistor 120, whose gate is connected to the output of inverter 107 which outputs CLK1, the strength can be controlled. It can also be made weaker in order to cause a longer delay time on the falling edge of CLK1. Therefore, when the CLKIN clock edge is rising, CLK1 from inverter 107 is falling. As a result, the clock edge on CLK2 is rising, which is the output of delay inverter 115. The timing of the falling edge of CLK2 is controlled by NMOS transistor 121. The rising edge of CLK2 is controlled by the strength of not only PMOS transistor 120, whose gate is connected to CLK1, but also PMOS transistor 119, whose gate is connected to PBIAS which is the regulating voltage, for controlling the amount of delay through the delay inverter 115.

The node PBIAS can be adjusted to make PMOS transistor 120 weaker such that it takes longer to pull up the output of the delay inverter 115, the output being CLK2. In this manner, the rising edge of CLK2 is delayed, but the falling edge is allowed to upgrade at its normal speed. Inverter 108 and inverter 109 act as buffers and can be used to adjust the rise time of the resultant clock signal CLKOUT.

With further reference to FIG. 3, the waveform CLK2 appears to have a fast fall time but a long rise time. FIG. 3 also shows the outputs from inverter 108, CLK3 and inverter 109, CLKOUT. As can be seen, there is a slight delay which originates due to the switching threshold of inverter 108. CLK3 has a fast rising edge, then suffers delay time through inverter 109. At the output of inverter 108, the fall time of clock signal CLK3 is sharper. When the clock signal exits inverter 109, the clock signal CLKOUT is improved further. As can be seen, CLKOUT has a sharp rising edge and a sharp falling edge. By the time the clock signal exits at pin 111 as CLKOUT, the falling edge has been delayed due to the series of inverters 107, 108 and 109. This delay is minimal, but the rising edge is delayed more as a result of the action of delay inverter 115. The net result is that the rising edge has been delayed by much more than the falling edge.

The signal PBIAS must be controlled in order to obtain the right amount of delay through delay inverter 115. Because the circuit is operable to delay the rising edge of the clock signal, a determination must be made about how much to delay the rising edge such that CLKOUT has the desired duty cycle.

This can be accomplished using a charge pump integrator. Referring again to FIG. 2, charge pump integrator 102 comprises a current source 103 coupled to transistor 116 and current source 104 coupled to transistor 117 and capacitor 118. CLKSENSE is fed into a buffer, inverter 110 at the input to charge pump integrator 102. When CLKSENSE is low, NMOS transistor 117 is switched on and the current is drawn out of the PBIAS node 122. When current is drawn out of the PBIAS node 122, the voltage level on the PBIAS node goes down. When CLKSENSE, on the other hand, is high, then NMOS transistor 117 is switched off and complementary switch PMOS transistor 116 is switched on. Under that condition, current is injected into PBIAS from the upper current source 103 and PBIAS goes up in voltage due to the injected charge. Current is injected into the capacitor 118. As noted in FIG. 2, capacitor 118 is connected to the power supply Vdd 112.

The transistors within current source 103 constitute a current source on top of the circuit and the transistors within current source 104 constitute a current source on the bottom of the circuit. These transistors are arranged as current mirrors. In order to get a 50% duty cycle, the current output through current source 103 should closely approximate the current output through current source 104. When the current sources are equal, if the input clock is greater than 50% duty cycle, then the signal CLKSENSE will be high longer than it is low, resulting in an injection of current into PBIAS from current source 103 for a longer period of time than if the circuit is pulling current out of PBIAS from current source 104. If this is averaged over many clock cycles, the voltage at node PBIAS gradually rises. Conversely, if CLKSENSE is low longer than it is high, then on average, current will be pulled out of PBIAS for more time than it will be injected into PBIAS which will cause the voltage at node PBIAS to drift low over time. The amount of time it takes to drift high or low depends on how much current is being pumped from the current sources and the size of capacitor 118. If, however, CLKSENSE is high for 50% of the time and low for 50% of the time, then the circuit would be pushing current into capacitor 118 for exactly the same amount of time that it is pulling current out of the capacitor 118. There may be a very small triangular wave on PBIAS, due to the push and pull of the current, however, the average or DC level of PBIAS will remain fixed and will not drift up or down over time.

As noted above, charge pump integrator 102 pumps charge into or out of the referenced capacitor 118. Whether more charge is pumped in than out, or out than in, depends on the duty cycle of the clock signal CLKSENSE at input terminal pin 105. It also depends on the relative values of current flowing through currents sources 103 and 104. If equal amounts of charge are being pumped, then when there is a 50% duty cycle on the input, as much charge is going in as is being pulled out, and therefore, the DC average of the PBIAS signal will remain constant, which is the desired result in one exemplary embodiment of the present invention. If charge pump integrator 102 is configured in a feedback loop with its output PBIAS being the controlling node of the delay inverter 115, then if the clock signal CLKIN at the input terminal 101 does not have a 50% duty cycle, then the charge pump integrator 102 will integrate such that it will adjust the delay the rising edge of the clock signal through the delay inverter 115 such that it will drive the duty cycle of the clock signal towards 50%.

As noted with this configuration, CLKOUT and CLKSENSE are virtually the same signal, although the two signals are shown as separate in FIG. 2. However, the output of the circuit at output terminal pin 111 can be fed back as the CLKSENSE signal at the charge pump integrator 102 input terminal pin 105. However, such an arrangement would not correct for any duty cycle corruption that might occur through any buffers that follow the clock squaring circuit. Therefore, by decoupling the CLKOUT and the CLKSENSE signals, it allows for a correction for any duty cycle corruption that might occur following the clock squaring circuit.

If CLKOUT at the output terminal pin 111, or a variation thereof, is fed back into the charge pump integrator 102 at input terminal pin 105, CLKSENSE can clock the charge pump integrator 102. Charge pump integrator 102 will integrate up or down if CLKSENSE does not have a 50% duty cycle. Because the circuit is connected such that negative feedback is provided, if the integration is in the positive direction, then PMOS transistor 119 is being weakened, such that more delay is provided to the rising edge at the CLK2 node 106 which drives the output toward a 50% duty cycle.

Because charge pump integrator 102 ideally has infinite gain at DC, there should be no error other than errors that are introduced due to mismatches in the current sources 103 and 104. Therefore, the circuit of the present invention should optimally have good matching in the devices comprising the upper and lower current sources 103 and 104, however, the present invention does not require an absolute value of current through the current sources. Capacitor 118 does not require a low value tolerance because the value affects the delay time around the closed loop and the amount of filtering on the signal. If capacitor 118 has a very small value or if the amount of charge pump current is very large, then there could be developed a very large ripple on PBIAS. The amplitude of this triangle wave is dependent on the amount of current that is pumped into PBIAS and the size of the capacitor 118, as well as the clock frequency. A larger value capacitor can be used to reduce the ripple.

The charge pump current can be further controlled by trim arrangement 123. In this manner, the current into PBIAS at node 122 can be accurately set. The purpose of PMOS transistor 130 is to interrupt that current when the chip is being powered down. When PMOS transistor 130 is switched off it stops the current that powers the block. The use of PMOS transistor 130 is not a necessary feature of the present invention. In addition, NMOS transistor 131 is not a necessary feature of the present invention. It is also a power down device that forces PBIAS node 122 low when the chip is powered down.

NMOS transistors 140 and 141 are actually two devices in parallel that form a diode connected device that comprises the first half of a standard MOS current mirror. NMOS transistors 142, 143, 144 and 145 are mirror devices. NMOS transistor 142 is in parallel with NMOS transistor 145 and NMOS transistor 143 is in parallel with NMOS transistor 144. A similar arrangement can be seen in the top circuit of current source 103. The arrangement of the transistors in the charge pump integrator 102 in FIG. 2 illustrate the importance of matching the transistors. Each arrangement comprises a diode connected device, which is the master of the current mirror and two current slaves. More specifically, the current through the composite device comprised of transistors 142 and transistor 145, should be the same as current flowing through the composite device comprising transistor 140 and transistor 141. The current flowing in the composite device comprising transistor 143 and transistor 144 should be the same amount of current as in the other referenced composite devices. The master of current source 103 is the composite device comprising PMOS transistor 150 in parallel with PMOS transistor 151. The slave of current mirror 103 is the composite device comprising PMOS transistor 152 in parallel with PMOS transistor 153.

Depending on the accuracy of these current mirrors, the same current should flow into node 125 from upper current source 103 as is flowing out of node 123 from lower current source 104. Transistors 154, 146 and 155, 147 as seen in FIG. 2 are dummy devices used for matching purposes and to improve the layout of the devices. Capacitors 160 and 161 are capacitors used to filter out some of the current noise that might be present in the currents.

Figure 4A:
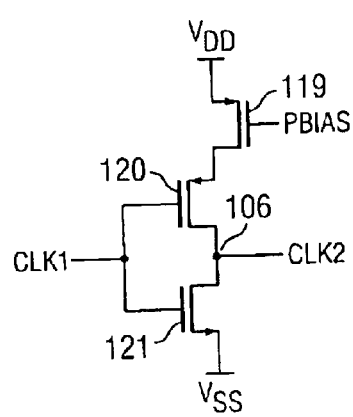
FIGS. 4(a)–(d) illustrate four (4) alternative configurations for a delay inverter used in the present invention.
Figure 4B:
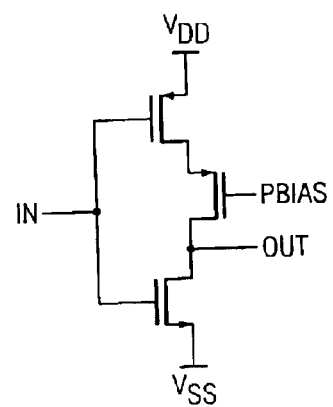
Figure 4C:
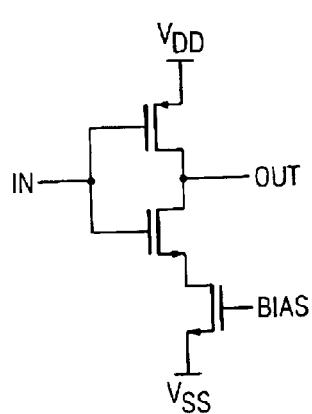
Figure 4D:
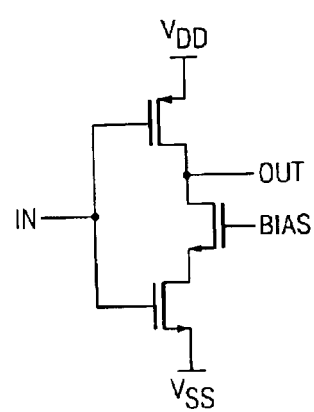

FIGS. 4(a)–(d) illustrate four (4) alternative configurations for a delay inverter used in the present invention. FIG. 4(a) corresponds to the arrangement of the delay inverter in FIG. 2. As seen therein, delay inverter 115 is comprised of PMOS transistor 119, PMOS transistor 120 and NMOS transistor 121. The gate of PMOS transistor 119 is controlled by PBIAS. FIGS. 4(b)–4(d) illustrate alternative delay inverter arrangements.

Alternative Exemplary Embodiment

The clock squaring circuit of the present invention can be adapted to work for input clock signals at CLKIN pin 101 with duty cycles greater than 50% or less than 50% by adding a fixed delay to the falling edge of CLKIN. This may be implemented in a number of ways, including modifying inverter 107 to delay the rising edge of CLK1 as described above or by delaying the rising edge of CLK3 in the second inverter 108. For example, if the input clock signal is not biased in one direction or the other in terms of duty cycle, the circuit could be modified such that the original circuit could handle an input whose duty cycle is biased low. One exemplary embodiment of the present invention is designed to handle a clock signal that has a duty cycle that is always biased high. With this modification or enhancement, it is possible to handle a clock signal that could either be biased low or biased high. This is done by applying, for example, a fixed delay on the falling edge and a variable delay on the rising edge of the clock signal. This would allow the circuit to handle a duty cycle range on the input which is greater than 50% and less than 50%. In other words, the duty cycle of the clock signal at the input could vary between greater than 50% or less than 50% and the circuit of the present invention could correct for the variation and output a clock signal with the desired duty cycle. The only modification required to obtain this alternative operation is to use a weak N channel transistor with a fixed bias which applies a fixed amount of delay on the falling edge of the clock signal, while retaining the varying amount of delay on the rising edge as described herein. Thus, the amount of correction achievable when the original clock signal has a duty cycle of less than 50%, is dependent on the amount of fixed bias provided, while continuing to correct on the rising edge using the variable correction provided by the circuit described herein. The fundamental concept of this alternative embodiment of the present invention is that one edge of the clock signal is variable and controlled by the circuit and the other edge of the clock signal is a fixed non-attributable amount of delay.

The circuit described herein can be included on a Codec chip that is complementary to a DSP chip with the corrected clock signal being provided by the Codec to the DSP chip. However, the design could be implemented on any chip, including a DSP chip, that requires a clock signal with a desired frequency and duty cycle that consumes low power.

The exemplary embodiment of the present invention addresses many of the shortcomings of the prior art. The present invention may be described herein in terms of various functional components. It should be appreciated that such functional components may be realized by any number of hardware or structural components configured to perform the specified functions. For example, the present invention may employ various integrated components, such as buffers, supply rail references, current mirrors, logic devices and the like, which are comprised of various electrical devices, such as resistors, transistors, capacitors, diodes and the like whose values may be suitably configured for various intended purposes. Additionally, the various components may be implemented in alternate ways, such as, for example, the changing of transistor devices from PMOS to NMOS transistors and the changing of the polarity of the charge pump circuits. These alternatives can be suitably selected depending upon the particular application or in consideration of any number of factors associated with the operation of the system. In addition, the present invention may be practiced in any integrated circuit application where a clock signal with a desired frequency and duty cycle is desired. Such general applications that may be appreciated by those skilled in the art in light of the present disclosure are not described in detail herein. However for purposes of illustration only, one exemplary embodiment of the present invention will be described herein in connection with a circuit that achieves a clock signal with a desired frequency and a 50% duty cycle. Further, it should be noted that while various components may be suitably coupled or connected to other components within the exemplary circuit, such connections and couplings can be realized either by direct connection between components, or by connection through other components and devices located there between. These and other changes or modifications are intended to be included within the scope of the present invention, as expressed in the following claims.

What is claimed is:

1. A circuit for modifying the duty cycle of a signal, the circuit being comprised of:
   a charge pump integrator configured in a feedback loop and having an output;
   a delay inverter having an input terminal accepting an input signal having a controlling node; and
   the output of the charge pump integrator being coupled to the controlling node of the delay inverter.

2. The circuit of claim 1, further comprising the charge pump integrator and the delay inverter being operable to control a rising edge of the signal through the delay inverter.

3. The circuit of claim 2, further comprising a delay circuit in series with the delay inverter operable to apply a fixed delay to a falling edge of the signal.

4. The circuit of claim 3, wherein the delay circuit includes a weak N channel transistor with a fixed bias operable to apply a fixed amount of delay on the falling edge of the signal.

5. The circuit of claim 1, further comprising the charge pump integrator and the delay inverter being operable to delay the rising edge of the signal through the delay inverter.

6. The circuit of claim 1, the delay inverter further comprising:
   a first PMOS transistor;
   a second PMOS transistor;
   an NMOS transistor;
   the first PMOS transistor being coupled to the second PMOS transistor;
   the gate of the first PMOS transistor being coupled to the output of the charge pump integrator;
   the NMOS transistor being coupled to the second PMOS transistor;
   the input terminal being at a first node coupling the gates of the second PMOS transistor and the NMOS transistor; and
   an output terminal coupled to the delay inverter being a second node coupling the drain of the second PMOS transistor and the drain of the NMOS transistor.

7. The circuit of claim 6, wherein the circuit is adapted to modify the input signal comprising a clock signal with a desired frequency and undesired duty cycle, and the output comprises a clock signal with a desired frequency and desired duty cycle.

8. The circuit of claim 1, further comprising the charge pump integrator and delay inverter being configured in the feedback loop, the output of the charge pump integrator being provided to the controlling node of the delay inverter.

9. The circuit of claim 8 wherein the delay inverter further comprises:
   a first PMOS transistor;
   a second PMOS transistor;
   an NMOS transistor;
   a first voltage rail Vdd;
   the source of the first PMOS transistor also being coupled to the first voltage rail Vdd;
   the drain of the first PMOS transistor being coupled to the source of the second PMOS transistor;
   the drain of the second PMOS transistor being coupled to the drain of the NMOS transistor;
   a second voltage rail Vss;
   the source of the NMOS transistor being coupled to the second voltage rail Vss; and
   the gate of the second PMOS transistor being coupled to the gate of the NMOS transistor.

10. The circuit of claim 9, further comprising:
    a first buffer coupled in series between the input terminal and the delay inverter and operable to buffer and invert the input signal;
    an output of the first buffer being coupled the gates of the second PMOS transistor and the NMOS transistor; and
    the output terminal of the charge pump integrator, being coupled to the controlling node of the delay inverter operable to bias the first PMOS transistor.

11. The circuit of claim 10, wherein the delay inverter output outputs a modified clock signal at a node coupling the drain of the second PMOS transistor and the drain of the NMOS transistor.

12. The circuit of claim 11, further comprising a plurality of output buffers coupled in series between the node coupling the drain of the second PMOS transistor and the drain of the NMOS transistor, operable to buffer the signal.

13. The circuit of claim 12, wherein the output buffers further comprise inverters.

14. The circuit of claim 13, wherein the inverters comprise NOT gates.

15. The circuit of claim 1, wherein said delay inverter comprises further PMOS transistors and a NMOS transistor having operating characteristics operable to accept a clock signal with an undesired duty cycle and output a clock signal with a desired duty cycle.

16. The circuit of claim 15, wherein the desired duty cycle is approximately 50%.

17. The circuit of claim 1, wherein the charge pump integrator further comprises:
    a first current source;
    a second current source;
    a capacitor; and
    the first current source and the second current source being coupled at their outputs to the capacitor and the delay inverter; and
    the current sources, capacitor and the delay inverter being operable to delay an edge of a clock signal.

* * * * *